United States Patent [19]

Kumar et al.

[11] Patent Number: 5,851,926
[45] Date of Patent: Dec. 22, 1998

[54] METHOD FOR ETCHING TRANSISTOR GATES USING A HARDMASK

[75] Inventors: Ajay Kumar, Sunnyvale; Jeffrey Chinn, Foster City; Shashank C. Deshmukh, Sunnyvale; Weinan Jiang, Santa Clara; Rolf Adolf Guenther, Monte Sereno; Bruce Minaee, Campbell; Mark Wiltse, Redwood City, all of Calif.

[73] Assignee: Applied Materials, Inc, Santa Clara, Calif.

[21] Appl. No.: 724,383

[22] Filed: Oct. 1, 1996

[51] Int. Cl.[6] .................................... H01L 21/3065
[52] U.S. Cl. ...................... 438/714; 438/719; 438/738; 438/659; 252/79.1
[58] Field of Search .................... 438/721, 719, 438/738, 659, 714; 252/79.1

[56] References Cited

U.S. PATENT DOCUMENTS

| | | | |
|---|---|---|---|
| 5,188,704 | 2/1993 | Babie et al. | 156/643 |
| 5,228,950 | 7/1993 | Webb et al. | 156/643 |
| 5,346,586 | 9/1994 | Keller | 156/656 |
| 5,358,601 | 10/1994 | Cathey | 156/656 |
| 5,431,772 | 7/1995 | Babie et al. | 156/643.1 |
| 5,605,601 | 2/1997 | Kawasaki | 165/643.1 |

FOREIGN PATENT DOCUMENTS 0 665 579 A1  8/1995  European Pat. Off. ........ H01L 21/28

*Primary Examiner*—Gary Geist
*Assistant Examiner*—Jean E. Vollano
*Attorney, Agent, or Firm*—Birgit E. Morris; James C. Wilson

[57] ABSTRACT

An etchant composition of nitrogen trifluoride and chlorine, preferably also including a passivation material such as hydrogen bromide, etches tungsten silicide-polysilicon gate layers with high selectivity to a thin underlying silicon oxide gate oxide layer to form straight wall, perpendicular profiles with low microloading and excellent profile control.

5 Claims, 4 Drawing Sheets

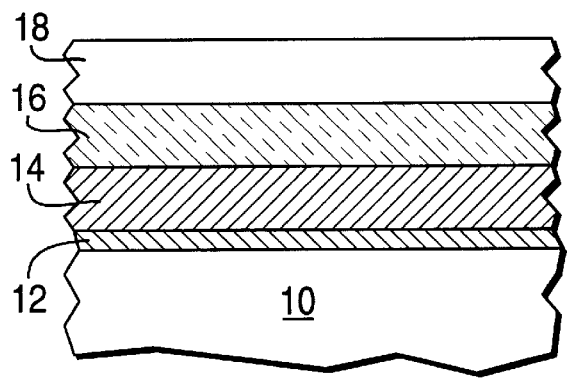
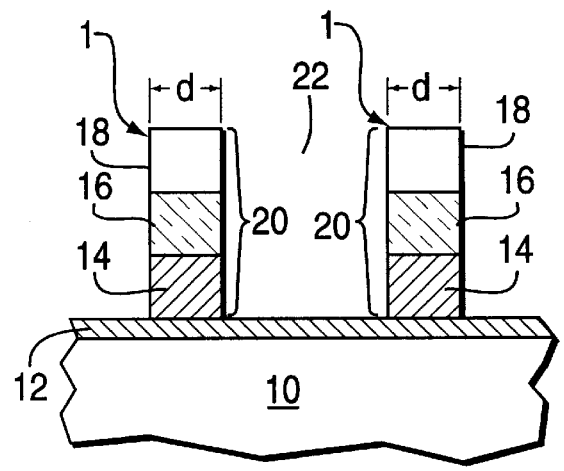
FIG. 1     FIG. 2
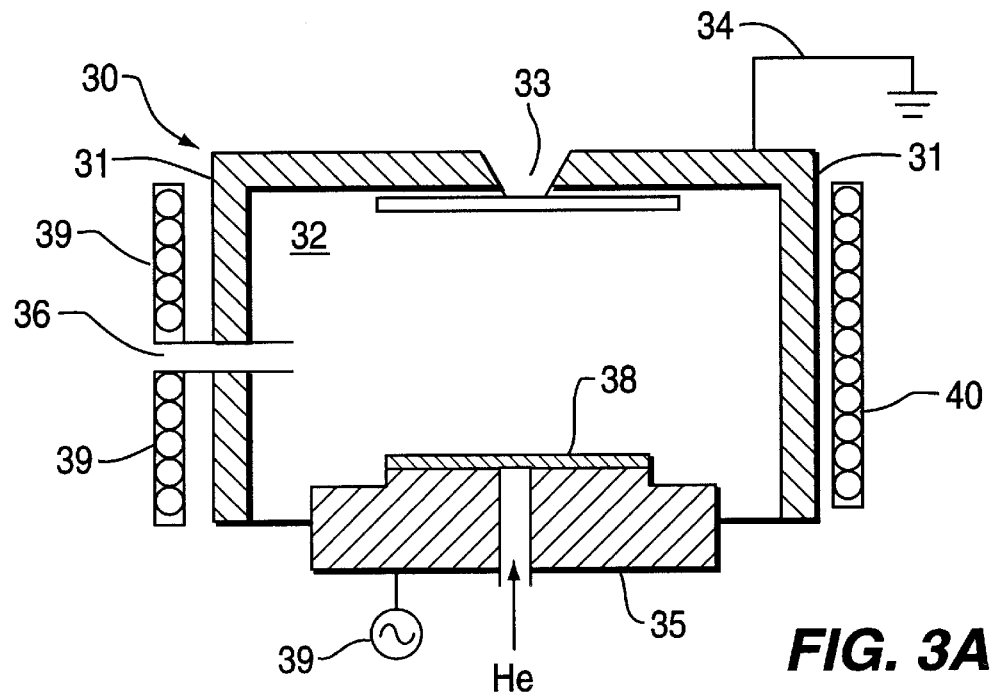
FIG. 3A
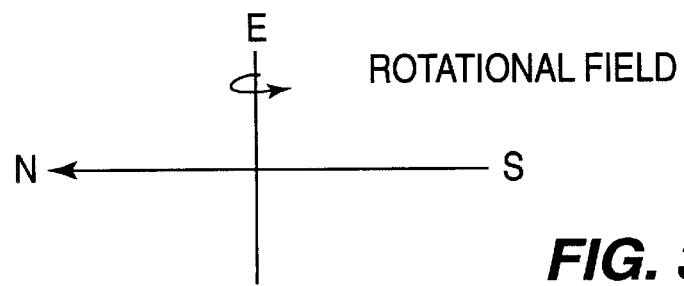
FIG. 3B

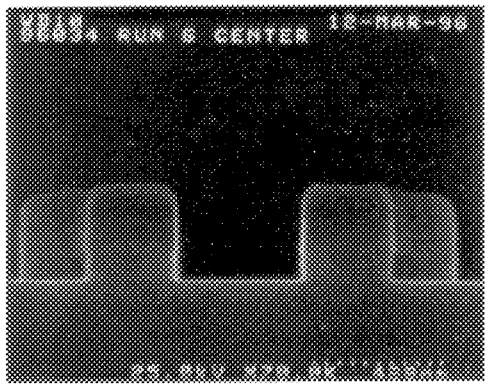
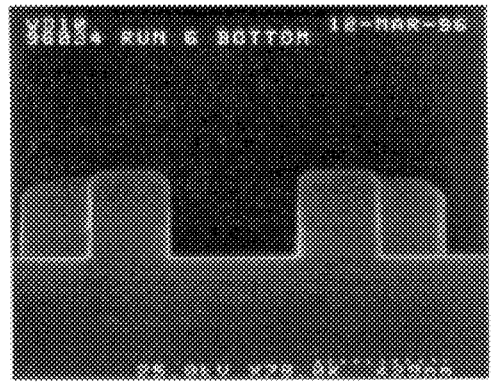
FIG. 4A                FIG. 4B
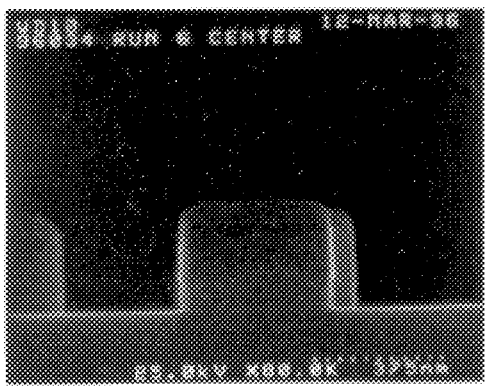
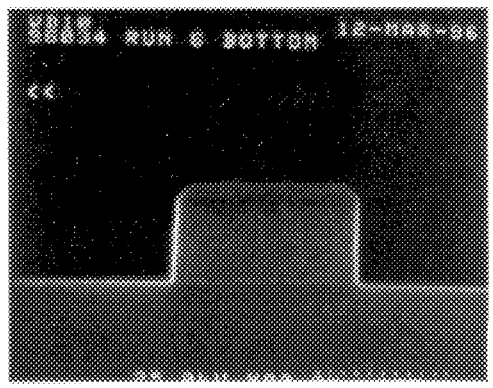
FIG. 4C                FIG. 4D

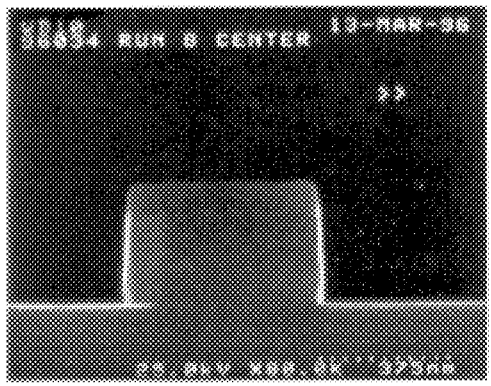 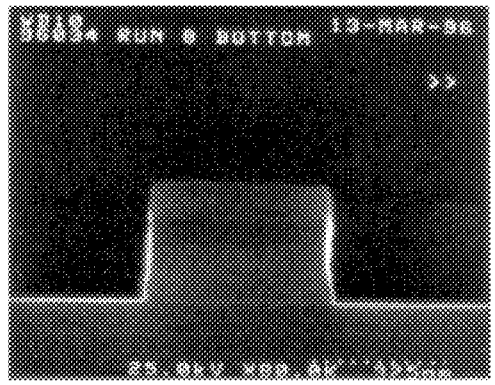
FIG. 5A  FIG. 5B
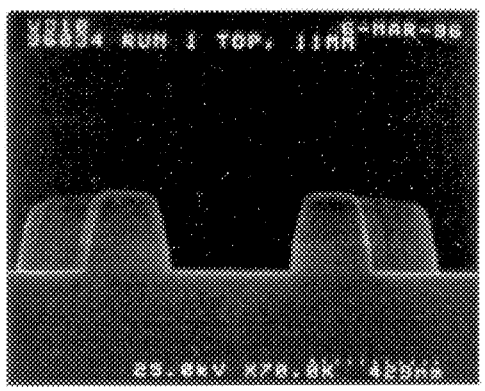 
FIG. 6A  FIG. 6B
 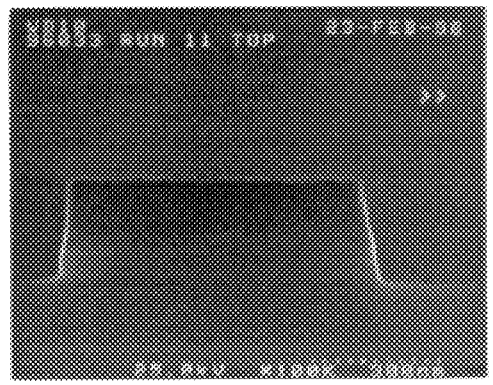
FIG. 7A  FIG. 7B

METHOD FOR ETCHING TRANSISTOR GATES USING A HARDMASK

This invention relates to an improved etch chemistry for etching a bilayer of tungsten silicide and polysilicon used to make transistor gates. More particularly, this invention relates to an improved etch composition for selectively etching tungsten silicide and polysilicon over a gate oxide layer.

BACKGROUND OF THE INVENTION

In the manufacture of transistors for integrated circuits, a conductive gate layer or layers is deposited over a gate oxide layer. In the particular transistor gate discussed herein, a first layer of polysilicon and a second layer of tungsten silicide are deposited sequentially over a gate oxide layer. In the conventional manufacture of the gate, a photoresist layer is deposited over the layers, the photoresist is patterned, and the tungsten silicide and polysilicon layers are etched selectively down to the gate oxide layer.

FIG. 1 illustrates the initial sequence of layers used to form the present transistor gates. In FIG. 1. a gate oxide layer 12 is put down first over the substrate 10, a polysilicon layer 14, a tungsten silicide layer 16 and a photoresist layer 18 are sequentially deposited thereover.

After patterning the photoresist layer, the gate structure is etched down to the silicon oxide layer 12. The resultant patterned gates 1 are shown in FIG. 2. The photoresist layer 18 is then removed or stripped in conventional manner.

What is desired is that the gate structure of FIG. 2 have smooth, vertical sidewalls, with no undercutting either between the tungsten silicide and the polysilicon, or at the polysilicon- silicon oxide interface. A suitable conventional etchant is a mixture of $SF_6$ and HBr.

However, as devices become smaller and the cross section of the gates is below 0.5 micron, photoresist has been found to be inadequate to maintain dimensional control during the etch. In particular, using photoresist, it has been found that some gate structures, particularly at the end of a row of gates, or for more isolated gate structures, the dimensional control is not acceptable and the sidewall profiles are non-uniform. This is known as microloading or profile microloading.

Thus a hardmask of silicon oxide is substituted for the photoresist. In such case, a silicon oxide layer is deposited over the tungsten silicide layer, followed by photoresist. The photoresist is patterned in conventional manner, and the oxide layer is selectively etched to form the hardmask. Good control of dimensions of the oxide hardmask layer can be obtained to form gates having a cross section below 0.5 micron, e.g., 0.25–0.35 micron. The photoresist layer is stripped and the patterned oxide layer is used as the masking layer to etch the gate layers. The resultant structure is the same as shown in FIG. 2, except that a hardmask layer is substituted for the photoresist layer 18. The etched sidewalls 20 should be straight with an opening 22 formed between them.

The thickness of the gate oxide layer 12 is very important and varies with the gate length in accordance with the device design. However, for fast, smaller devices, the thickness of the gate oxide layer 12 is preferably on the order of 90 angstroms thick. If the gate oxide layer is too thick, the device speed is lowered. If the gate oxide layer is too thin, there is a danger of etching through this layer to the underlying substrate, shorting out the device.

Since the gate oxide layer 12 is thin in comparison to the thickness of the gate layers, a high selectivity between the polysilicon layer 14 and the gate oxide layer 12 is required to avoid etching through the thin gate oxide layer 12.

Typically the transistor gates herein include a polysilicon layer 14 about 1000 Å thick; a tungsten silicide layer 16 about 1500 Å thick and a hardmask silicon oxide layer about 5000 Å thick. Using silicon oxide hardmasks, microloading is improved, selectivity is improved and the critical dimension is higher.

However, we have found that the etchant chemistry comprising $SF_6$ and HBr is inadequate to form gates at uniform etch rates, and that undercutting is a problem. Microloading is high, with a 10–12% variation across the substrate. Thus other etchant compositions have been tried, including substituting chlorine for HBr. A composition of HCl, $Cl_2$ and $N_2$ has also been tried. However, none of these etch compositions meet all of the requirements for this etch process, including low microloading, and the good sidewall passivation required to form straight etched walls, high selectivity between the polysilicon and the gate oxide layers, and high etch rates.

Thus the search for an improved etch composition for the subject gate stack has continued.

SUMMARY OF THE INVENTION

We have found that employing an etch composition comprising $NF_3$ and $Cl_2$ for etching transistor gates comprising tungsten silicide and polysilicon provides low microloading for the hard mask, high etch selectivity to the gate oxide and excellent profile control, as well as acceptable etch rates. Additionally the etchant composition preferably includes a sidewall passivant such as hydrogen bromide (HBr). Other passivation materials such as nitrogen and/or oxygen can also be used.

BRIEF DESCRIPTION OF THE DRAWING

FIG. 1 is a cross sectional view of an unetched gate structure for a tungsten silicide-polysilicon gate.

FIG. 2 is a cross sectional view of the gate structure of FIG. 1 after etching.

FIGS. 3A and 3B are a cross sectional view of an etch chamber in which the present etch process can be carried out.

FIGS. 4A, 4B, 4C and 4D are photomicrographs of cross sectional views of gate structures etched using the etchant composition of the invention.

FIGS. 5A and 5B are photomicrographs of cross sectional views of gate structures etched using an etchant composition of the prior art.

FIGS. 6A and 6B are photomicrographs of cross sectional views of gate structures etched using an alternate etchant composition of the prior art.

FIGS. 7A and 7B are photomicrographs of cross sectional views of gate structures etching using still another alternate etchant composition of the prior art.

DETAILED DESCRIPTION OF THE INVENTION

Figure 8A:
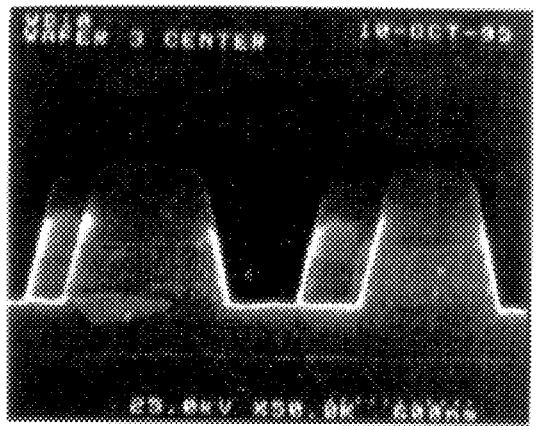
FIGS. 8A, 8B and 8C are photomicrographs of cross sectional views of gate structures etched in accordance with the invention at varying substrate temperatures.

The optimal criteria desired for etching gate structures of the invention is a high etch rate for both polysilicon and tungsten silicide of about 2000–3000 angstroms per minute (Å/min), with a selectivity close to 1:1 between the tungsten silicide and the polysilicon layers, and a higher selectivity, i.e., about 5:1 selectivity between the polysilicon and the hardmask gate oxide layer; a wall profile angle of close to 90° with respect to the substrate; a variation in etch uniformity of 3% or less across the wafer; reduced microloading and minimal etching of the gate oxide layer.

The present etch composition has a selectivity of tungsten silicide:polysilicon of 0.75:1, and a selectivity of polysilicon to the hardmask gate oxide of 2.8:1. The overall etch rate is about 2000 to 2200 Å/min for tungsten silicide, and about 3000 Å/min for polysilicon.

After indication that an end point has been reached, it is standard practice to perform an "overetch" to remove all material from the bottom of the opening adjacent to the gate oxide layer. The overetch rate for the present etch composition is high, 2500 Å/min, the uniformity is good at about 5% and selectivity to the gate oxide is high at 85:1.

The present etch process can be carried out advantageously in an etch chamber as shown in FIG. 3A. The chamber 30 includes walls 31 housing a reactor chamber 32. Processing gases are introduced to the chamber 32 via a nozzle 33. The nozzle 33 is connected to the walls 31 which are grounded via line 34. A cathode support electrode 35 supports the wafer 38 to be treated. The wafer 38 is passed into the chamber by means of a slit valve 36. The cathode support electrode 35 is connected to a source of power 39 and is also connected to an elevator mechanism (not shown) for raising and lowering the support 35 while the wafer 38 is moved into and out of the chamber. The wafer 38 can be cooled by passing a flow of helium to the backside of the wafer 38. Conventional clamps or fingers (not shown) connected to the support electrode 35 maintain the wafer 38 in alignment during processing. A suitable pressure is maintained in the chamber by an exhaust system (not shown). A plasma is formed from the processing gases in the region between the anode and the support electrode.

A pair of helmholtz configured electromagnetic coils 39, 40, provide a transverse magnetic field with the north and south poles at the left and right providing a horizontal magnetic field axis parallel to the surface of the wafer 38. The transverse magnetic field is applied to slow the vertical velocity of electrons in the plasma which are accelerated radially by the magnetic field as they move towards the wafer 38. Accordingly, the quantity of electrons in the plasma is increased by means of this transverse magnetic field and the plasma is enhanced. Thus the potential drop across the cathode sheath can be decreased to increase the ion current flux present on the wafer surface, permitting higher rates of etching without requiring higher ion energies to achieve this result. As shown in FIG. 3B, the vector of the magnetic field rotates about the center axis of the electrical field by varying the phases of current flowing through the coils 39, 40 at a typical rotational frequency of 0.01 to 1 Hz, producing a variable strength of the magnetic flux, typically from 0–150 Gauss, determined by the current supplied to the coils.

Suitable chambers are available commercially from Applied Materials, Inc as the MxP or MxP Plus chamber.

The power to the chamber is generally set at 100–500 watts. If the power is too low, an inverse taper for the openings may be obtained, which is not desirable, particularly when the openings 22 are to be filled in.

The pressure during etching is generally maintained at about 20 to 25 millitorr to maintain straight sidewalls of the etched profiles.

The composition of the etchant of the invention preferably includes from 75 to 85% by volume of chlorine and from 15 to 25% by volume of $NF_3$. When HBr is also used, the preferred etchant composition is 75 to 80% by volume of chlorine, 10 to 15% by volume of $NF_3$ and 5 to 10% by volume of HBr.

Since, as is set forth in greater detail below, the temperature of the substrate affects the sidewall taper and the etch rate, the temperature of the substrate during etching is chosen depending on the sidewall taper and etch rate desired.

The invention will be set forth in greater detail in the following examples, but the invention is not to be limited to the details therein.

EXAMPLE 1

A silicon wafer having a layer of gate oxide thereon about 90 Å thick, a layer of polysilicon 1000 Å thick thereover, a layer of tungsten silicide ($WSi_x$) 1500 Å thick and a patterned silicon oxide hardmask layer thereover 1500 Å thick was patterned as an array of openings having 0.3 micron dimensions, in an etch chamber as in FIG. 3. The pressure of the chamber was brought to 20 millitorr.

A gas flow of 20 sccm of $NF_3$, 15 sccm of HBr and 90 sccm of chlorine was passed into the chamber. The power was set at 500 watts, and the magnetic field at 30 gauss. The substrate temperature was 80° C. Etching was continued for 47 seconds for an etch rate of about 2200 Å/min for the tungsten silicide.

An overetch was carried out for 30 seconds using an etch composition of 50 sccm HBr, 10 sccm of chlorine and 3 sccm or a helium/oxygen mixture at 80 millitorr pressure, power of 150 watts, and magnetic field at 30 gauss. The etch rate was 2500 Å/min, the etch rate uniformity was 5%, and the selectivity to the gate oxide was about 85:1.

FIGS. 4A, 4B, 4C and 4D is a series of cross sectional views of the resulting openings taken from the center (4A and 4B) and edge (4C and 4D) of the wafer. It is apparent that the openings had straight sidewalls with no undercutting.

The etch rate was 2200 Å/min and the etch rate uniformity across the wafer was 5.1%; the selectivity of $WSi_x$ to polysilicon was 0.75:1 and the selectivity to the gate oxide was 2.8:1; etch rate microloading was less than 3%; and the profile microloading variation was less than 1°; that is, the angle of the sidewall with respect to the substrate was found to be 89° for an opening at the center of the wafer, and 90° for an opening at the edge of the wafer. A slight faceting of the upper edge of the opening can be seen.

Control 1

The procedure of Example 1 was followed except substituting as the gas flows 25 sccm of $SF_6$ and 35 sccm of chlorine. The pressure was held at 25 millitorr, the power was set at 275 watts, the magnetic field at 30 gauss, and the substrate temperature was 40° C. Etching was continued for 50 seconds.

An overetch was carried out as in Example 1. The overetch rate was 1250 Å/min, the overetch uniformity was 3% and the selectivity of polysilicon to the gate oxide was about 100:1.

The etch rate was 2400 Å/min and the etch rate uniformity was 6–8%; microloading was 6–7%, and profile microloading was 5–7%. The angle between the sidewall and the substrate was 87° at the center of the wafer and 92° at the edge of the wafer. Also the sidewalls were more tapered than those formed in Example 1 as can be seen in FIGS. 5A and 5B. Some undercutting is apparent.

Control 2

The procedure of Example 1 was followed except substituting the following gas flows: 60 sccm $SF_6$ and 20 sccm HBr. The pressure was held at 20 millitorr, the power was set at 250 watts, the magnetic field at 30 gauss and the substrate temperature was 80° C. An overetch was carried out as in Example 1.

The etch rate uniformity was only 10–13%; etch rate microloading was 10–12%; and profile microloading was less than 1°. As can be seen in FIGS. 6A and 6B, some undercutting can be seen at the polysilicon to gate oxide interface. There is a marked taper to the etched profiles.

Control 3

The procedure of Example 1 was followed etching 0.25 micron openings. The etchant mixture was 26 sccm of chlorine and 52 sccm of $SF_6$. The chamber pressure was 25 millitorr, the power was set at 200 watts, and the magnetic field at 30 gauss.

An overetch was carried out as in Example 1.

The etched profiles are shown in FIGS. 7A and 7B for the center and edge of the wafer respectively. Slightly tapered sidewalls were obtained.

The etch rate uniformity was 6–8%, etch rate microloading was 5–7% and the profile microloading was 6–7%.

EXAMPLE 2

This example shows the variation of profile control versus substrate temperature during etching.

The procedure of Example 1 was followed using etchant gas flows of 90 sccm chlorine, 10 sccm $NF_3$ and 15 sccm HBr. The etch was done at a chamber pressure of 20 millitorr, the power set at 450 watts, the magnetic field at 30 gauss and the temperature at 40° C. No overetch was carried out on these samples.

FIG. 8A illustrates the profile obtained at 40° C. The sidewalls are somewhat tapered. The endpoint was reached in 87 seconds, with 14% of the polysilicon remaining.

Figure 8B:
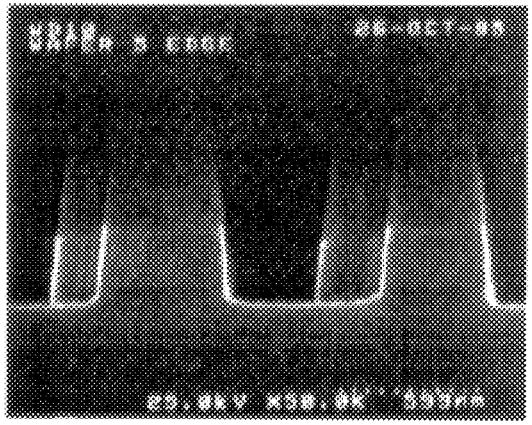

FIG. 8B illustrates the profile obtained at a 65° C. substrate temperature. The sidewalls are less tapered than those of FIG. 8A and no undercutting was observed. The endpoint was reached in 64 seconds, with 11% of the polysilicon remaining. Thus etching was more complete and the etch rate was higher.

At a substrate temperature of 80° C., when the power was increased to 500 watts and the gas flows were adjusted to 90 sccm of chlorine, 20 sccm of $NF_3$ and 10 sccm of HBr, the endpoint was reached in 40 seconds and only 10% of the polysilicon remained. Thus the etch rate here was significantly higher than the etch rate at the lower temperature.

Figure 8C:
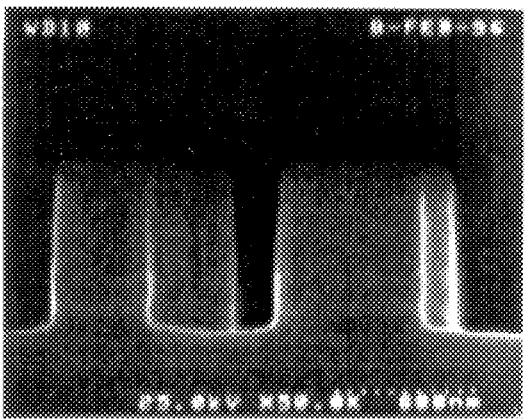

FIG. 8C illustrates the profile obtained. Straight walled profiles were obtained with no undercutting.

Although the invention has been described in terms of specific embodiments, various changes to the reaction conditions and gas flows can be made as will be known to those skilled in the art and are meant to be included herein. Various etch chambers are commercially available and can be used to carry out the present etch. The invention is only meant to be limited by the scope of the claims appended hereto.

We claim:

1. An etch composition for etching transistor gates on a silicon oxide layer comprising a layer of tungsten silicide over a layer of polysilicon adjacent to said silicon oxide layer, using a silicon oxide hardmask, comprising a mixture of nitrogen trifluoride, hydrogen bromide and chlorine.

2. An etch composition according to claim 1 additionally including one or members of the group consisting of nitrogen, oxygen and a carrier gas.

3. A method of etching transistor gates comprising sequential layers of gate oxide, polysilicon and tungsten silicide on a substrate and using a patterned silicon oxide layer as a hardmask comprising etching the tungsten silicide and polysilicon layers with an etchant composition including nitrogen trifluoride, hydrogen bromide and chlorine.

4. A method according to claim 3 wherein said tungsten silicide layer is about 1500 angstroms thick, said polysilicon layer is about 1000 angstroms thick and said gate oxide layer is about 90–100 angstroms thick.

5. A method according to claim 3 wherein the temperature of etching is chosen to obtain an opening having sidewalls at an angle of about 90 degrees with respect to said substrate.

* * * * *